(12) United States Patent
Mori et al.

(10) Patent No.: US 7,274,142 B2
(45) Date of Patent: Sep. 25, 2007

(54) DISPLAY UNIT HAVING SEALING STRUCTURE AND MANUFACTURING METHOD OF SAME

(75) Inventors: Takao Mori, Kanagawa (JP); Masashi Enda, Kanagawa (JP)

(73) Assignee: Sony Corporation, Tokyo (JP)

( * ) Notice: Subject to any disclaimer, the term of this patent is extended or adjusted under 35 U.S.C. 154(b) by 100 days.

(21) Appl. No.: 10/671,989

(22) Filed: Sep. 26, 2003

(65) Prior Publication Data

US 2004/0061434 A1 Apr. 1, 2004

(30) Foreign Application Priority Data

Oct. 1, 2002 (JP) ............................ P2002-288226

(51) Int. Cl.
*H05B 33/04* (2006.01)
(52) U.S. Cl. .................. 313/512; 313/504; 313/506; 428/690; 428/917
(58) Field of Classification Search ................ 313/512; 428/690
See application file for complete search history.

(56) References Cited

U.S. PATENT DOCUMENTS

| | | | |
|---|---|---|---|
| 6,635,989 B1* | 10/2003 | Nilsson et al. | 313/512 |
| 6,686,063 B2* | 2/2004 | Kobayashi | 428/690 |
| 6,720,203 B2* | 4/2004 | Carcia et al. | 438/99 |
| 6,781,746 B2* | 8/2004 | Yamazaki et al. | 359/321 |
| 2001/0031379 A1* | 10/2001 | Tera et al. | 428/690 |
| 2004/0046501 A1* | 3/2004 | Hayashi | 313/512 |

FOREIGN PATENT DOCUMENTS

| | | |
|---|---|---|
| EP | 1139453 A2 | 10/2001 |
| JP | 2002-270377 | 9/2002 |
| JP | 2002-280187 | 9/2002 |
| JP | 2001-380225 | 4/2003 |
| JP | 2003187969 A * | 7/2003 |
| JP | 2003-272849 | 9/2003 |
| JP | 2004-095199 | 3/2004 |
| WO | WO0065670 A1 | 11/2000 |

OTHER PUBLICATIONS

Japanese Office Action for JP 2002-288226 issued Jun. 29, 2006.

* cited by examiner

*Primary Examiner*—Sikha Roy
(74) *Attorney, Agent, or Firm*—Sonnenschein Nath & Rosenthal LLP (57) ABSTRACT

The invention provides a display unit which can improve reliability and reduce a frame area by forming a protective film in a uniform film thickness over an entire display area, and its manufacturing method. An end face of the protective film is formed along a vertical plane including a corresponding end face of a sealing substrate. The end face of the protective film is formed into an approximately vertical cross section in the position of the end face of the sealing substrate, and the entire display area is covered with the protective film in a uniform film thickness. It is preferable that a distance between a lower end of the end face and the vertical plane is set to 2 mm or less. It is preferable that the end face of the protective film is formed by anisotropic etching using the sealing substrate as a mask, after the protective film is formed over a whole face of a driving substrate.

5 Claims, 10 Drawing Sheets

DISPLAY UNIT HAVING SEALING STRUCTURE AND MANUFACTURING METHOD OF SAME

BACKGROUND OF THE INVENTION

1. Field of the Invention

The present invention relates to a display unit having a complete solid sealing structure wherein a driving substrate provided with a display area and a sealing substrate are bonded with an adhesive layer in between and its manufacturing method, and more particularly such a display unit wherein organic light emitting device is provided in its display area and its manufacturing method.

2. Description of the Related Art

As a display unit instead of a liquid crystal display, an organic light emitting display which uses organic light emitting device has been noted. The organic light emitting display has characteristics that its visual field angle is wide and its power consumption is low since it is a self-light emitting type display. The organic light emitting display is also thought of as a display having sufficient response to high-definition high-speed video signals, and is under development toward the practical use.

There is the possibility that in the organic light emitting display, an area which emits no light (dark spot) is generated and luminance deteriorates due to intrusion of moisture, oxygen and the like into the organic light emitting device. Thus, a sealing technique to inhibit intrusion of moisture or oxygen is essential. Conventionally, a measure has been taken in such a way that an adhesive is applied to a rim part of a rear panel, a sealing can made of metal or glass is bonded thereto, and a getter material such as calcium is enclosed in the space between the rear panel and the sealing can. This sealing method by using such sealing can, however, has problems in its manufacturing process and its cost. In addition, there is the possibility that intrusion of the moisture through the adhesive or the like into inside of the sealing can cannot be completely prevented.

In order to block moisture or oxygen, a structure wherein the organic light emitting device or the sealing can is covered with a thin film whose main components are a seal material and carbon has been suggested. (For example, refer to Japanese Unexamined Patent Application Publication Nos. 2002-93586 and 2002-93576.) However, in the case where sealing is made by covering the organic light emitting device by the thin film, there is a problem that a part which is not covered with the thin film is generated due to exfoliation of the thin film caused by residual stress and low step coverage. Therefore, in this case, it is difficult to completely block moisture, oxygen and the like from intruding into the organic light emitting device.

Consequently, a complete solid sealing structure wherein a driving substrate provided with organic light emitting device and a sealing substrate are bonded with an adhesive layer in between has been developed. In such complete solid sealing structure, there is no remaining clearance between the organic light emitting device and the sealing substrate, which causes intrusion of moisture or oxygen, so that reliability of a display can be improved.

In some complete solid sealing structures, the organic light emitting device formed on the driving substrate are covered with a protective film (passivation film). A peripheral frame area of the driving substrate is an external connection area provided with an external connection terminal to make connection between the organic light emitting device and a drive circuit or the like. When the protective film is formed on this external connection terminal, reliability of the terminal might be lowered. Therefore, conventionally, when the protective film is formed, the external connection terminal was masked. However, since masking causes limitation of active agent and separation of plasma, a film thickness distribution of the protective film at mask edge matters in general deposition processes such as sputter deposition, CVD (chemical vapor deposition) and the like, particularly in CVD. Namely, a film thickness of the protective film increases with a slant, and in the CVD process, though depending on a mask thickness and a shape, a width of about 5 mm may be necessary to obtain 90% of a given film thickness. Therefore, the frame area, i.e. the external connection area tends to be larger. In addition, there is the possibility that a distance between the slanting end face of the protective film and the organic light emitting device becomes short, leading to easy intrusion of moisture and the like, and then causing lowering of reliability of the organic light emitting device.

The above problems can be dealt by making the mask thickness thin. However, making the mask thickness thin causes lowering of adhesion of the mask. In particular, in some cases of the CVD process which has wraparound, the protective film gets into the clearance between the mask and a substrate or the external connection terminal, and reliability of the external connection terminal is ruined.

SUMMARY OF THE INVENTION

In light of the foregoing, it is an object of the invention to provide a display unit which can improve reliability and reduce a frame area by forming a protective film over an entire display area in a uniform film thickness and its manufacturing method.

A display unit according to the invention comprises a driving substrate having a display area and a sealing substrate arranged on a side where the display area of the driving substrate is provided. The driving substrate has a protective film which covers the display area and exposes an external connection area adjacent to the display area. The sealing substrate is arranged in an area corresponding to the display area of the driving substrate, and an end face of the protective film is formed along a vertical plane including an end face of the sealing substrate which lies on the same side as the end face of the protective film lies.

A method of manufacturing the display unit according to the invention is a method to manufacture the display unit, comprising the driving substrate having a display area and the sealing substrate arranged on the side where the display area of the driving substrate is provided. This manufacturing method includes the steps of: forming the protective film over the whole face on the side where the display area of the driving substrate is provided; arranging the sealing substrate in an area corresponding to the display area of the driving substrate; and forming an end face of the protective film along a vertical plane including an end face of the sealing substrate which lies on the same side as the end face of the protective film lies and covering the display area and exposing the external connection area adjacent to the display area by the protective film. Here, the end face of the protective film is preferably formed by anisotropic etching using the sealing substrate as a mask.

In the display unit and its manufacturing method according to the invention, the sealing substrate is arranged in an area corresponding to the display area of the driving substrate, and the end face of the protective film is formed along the vertical plane including the end face of the sealing substrate which lies on the same side as the end face of this protective film lies. Therefore, the end face of the protective film is formed into an approximately vertical cross section in the position of the end face of the sealing substrate, and the entire display area is covered with the protective film in a uniform film thickness. Consequently, intrusion of moisture or the like into the display area is prevented, reliability is improved, and the frame area, i.e. the external connection area is reduced.

Other and further objects, features and advantages of the invention will appear more fully from the following description.

DETAILED DESCRIPTION OF THE PREFERRED EMBODIMENTS

An embodiment of the invention will be described in detail hereinbelow with reference to the drawings.

Figure 1:
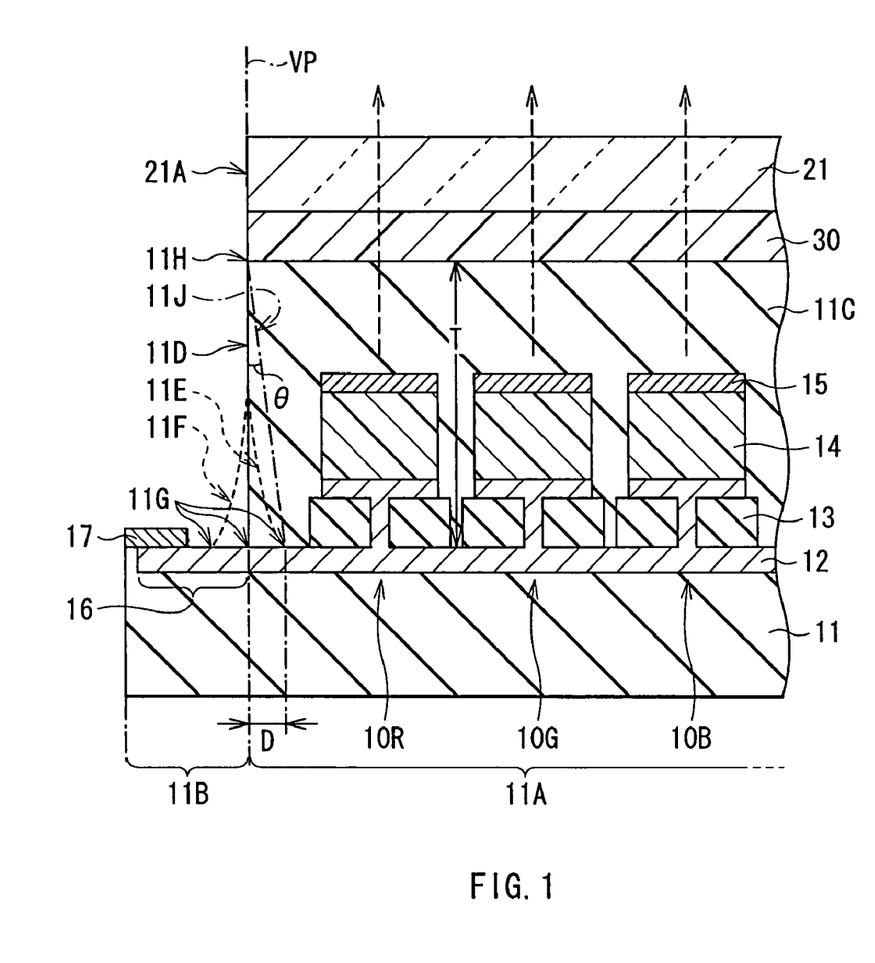
FIG. 1 is a cross sectional view showing a construction of a display unit according to an embodiment of the invention.

FIG. 1 shows a cross sectional construction of a display unit according to an embodiment of the invention. This display unit is used as an ultrathin organic light emitting color display unit or the like, and, for example, a driving substrate 11 and a sealing substrate 21 are placed opposite, and their whole faces are bonded by an adhesive layer 30.

The driving substrate 11 is made of an insulating material such as glass. The driving substrate 11 is provided with a display area 11A. The display area 11A is provided with, for example, an organic light emitting device 10R which emits red lights, an organic light emitting device 10G which emits green lights, and an organic light emitting device 10B which emits blue lights in order in a matrix state as a whole. An external connection area 11B is provided adjacently to this display area 11A in order to make connection between the organic light emitting devices 10R, 10G, and 10B and a drive circuit and the like. In addition, the display area 11A is covered with a protective film (passivation film) 11C to prevent moisture and the like from intruding into the organic light emitting devices 10R, 10G, and 10B.

In the organic light emitting devices 10R, 10G, and 10B, for example, a first electrode 12 as an anode, an insulating film 13, an organic layer 14, and a second electrode 15 as a cathode are layered in this order from the driving substrate 11 side. On the second electrode 15, the protective film 11C is formed.

The first electrode 12 also has a function as a reflection layer, so that it is desirable that the first electrode 12 has a reflectance as high as possible in order to improve light emitting efficiency. For example, materials to make the first electrode 12 include simple substances or alloys of metal elements with high work function, such as platinum (Pt), gold (Au), silver (Ag), chromium (Cr), tungsten (W) and the like. A thickness of the first electrode 12 in the layer direction (hereinafter simply referred to as "thickness") is preferably from 100 nm to 300 nm. As an alloy material, for example, AgPdCu alloy, whose main component is silver, and which contains palladium (Pd) of 0.3 wt % to 1 wt % and copper (Cu) of 0.3 wt % to 1 wt % can be cited.

A function of the insulating film 13 is, for example, to assure the insulation between each first electrode 12 of the adjacent organic light emitting devices 10R, 10G, and 10B. The insulating film 13 is, for example, has a thickness of about 300 nm, and made of an insulating material such as silicon dioxide ($SiO_2$).

Figure 2:
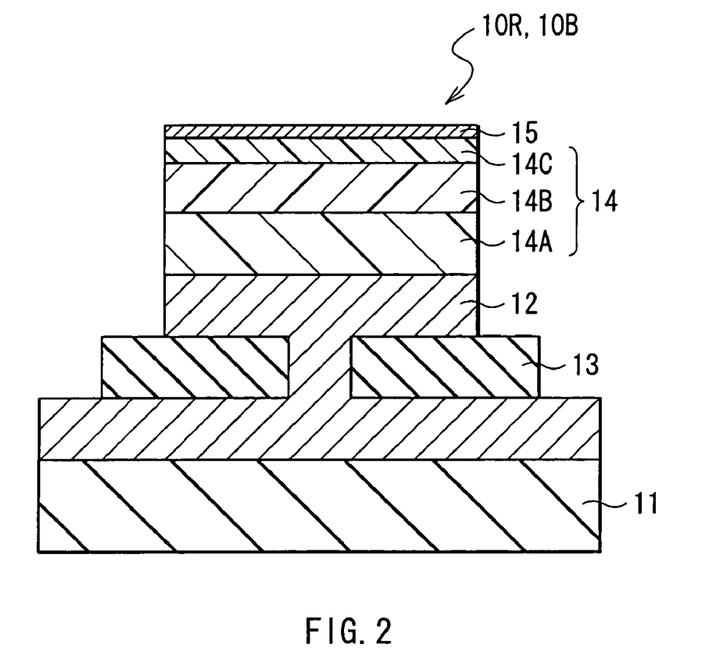
FIG. 2 is a cross sectional view showing an enlarged construction of an organic layer in organic light emitting device illustrated in FIG. 1.

A construction of the organic layer 14 varies according to light emitting colors of the organic light emitting device 10. FIG. 2 shows an enlarged view of a construction of the organic layer 14 in the organic light emitting devices 10R and 10B. The organic layer 14 of the organic light emitting devices 10R and 10B has a structure wherein an electron hole transport layer 14A, a light emitting layer 14B, and an electron transport layer 14C are layered in this order from the first electrode 12 side. The function of the electron hole transport layer 14A is to improve efficiency to inject electron holes into the light emitting layer 14B. In this embodiment, the electron hole transport layer 14A also has a function as an electron hole injection layer. The function of the light emitting layer 14B is to produce lights by current injection. The function of the electron transport layer 14C is to improve efficiency to inject electrons into the light emitting layer 14B.

The electron hole transport layer 14A of the organic light emitting device 10R, for example, has a thickness of about 45 nm, and made of bis [(N-naphthyl)-N-phenyl] benzidine (α-NPD). The light emitting layer 14B of the organic light emitting device 10R, for example, has a thickness of about 50 nm, and made of 2,5-bis [4-[N-(4-methoxyphenyl)-N-phenylamino]] stilbenzene-1,4-dica-bonitrile (BSB). The electron transport layer 14C of the organic light emitting device 10R, for example, has a thickness of about 30 nm, and made of 8-quinolinol aluminum complex ($Alq_3$).

The electron hole transport layer 14A of the organic light emitting device 10B, for example, has a thickness of about 30 nm, and made of α-NPD. The light emitting layer 14B of the organic light emitting device 10B, for example, has a thickness of about 30 nm, and made of 4,4'-bis (2,2'-diphenyl vinyl) biphenyl (DPVBi). The electron transport layer 14C of the organic light emitting device 10B, for example, has a thickness of about 30 nm, and made of $Alq_3$.

Figure 3:
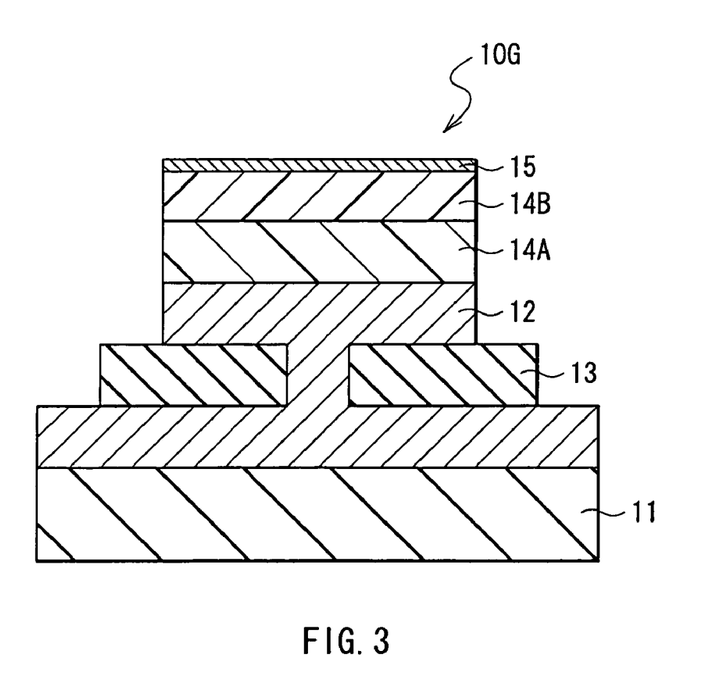
FIG. 3 is a cross sectional view showing an enlarged construction of an organic layer in an organic light emitting device illustrated in FIG. 1.

FIG. 3 shows an enlarged view of a construction of the organic layer 14 in the organic light emitting device 10G. The organic layer 14 of the organic light emitting device 10G has a structure wherein the electron hole transport layer 14A and the light emitting layer 14B are layered in this order from the first electrode 12 side. The electron hole transport layer 14A also has a function as an electron hole injection layer. The light emitting layer 14B also has a function as an electron transport layer.

The electron hole transport layer 14A of the organic light emitting device 10G, for example, has a thickness of about 50 nm, and made of α-NPD. The light emitting layer 14B of the organic light emitting device 10G, for example, has a thickness of about 60 nm, and made of $Alq_3$ mixed with coumarin 6 (C6) of 1 vol %.

The second electrode 15 shown in FIGS. 1 to 3, for example, has a thickness of 5 nm to 50 nm, and made of a simple substance or an alloy of metal elements with low work function, such as aluminum (Al), magnesium (Mg), calcium (Ca), sodium (Na) and the like. Specially, an alloy made of magnesium and silver (MgAg alloy) is preferable, and a mass ratio of magnesium and silver is preferably Mg:Ag=5:1 to 20:1.

The sealing substrate 21, as shown in FIG. 1, seals the organic light emitting devices 10R, 10G, and 10B with the adhesive layer 30. The sealing substrate 21 is made of a material such as glass which is transparent to the lights generated in the organic light emitting devices 10R, 10G, and 10B, and arranged in the area corresponding to the display area 11A of the driving substrate 11.

In the external connection area 11B shown in FIG. 1, the first electrode 12 of the organic light emitting devices 10R, 10G, and 10B is extended to outside of the protective film 11C, and becomes an external connection terminal 16. On the external connection terminal 16, a external terminal 17 is provided. Though not shown in the figure, the external connection area 11B is provided for the second electrode 15 as well.

The protective film 11C shown in FIG. 1 is formed to cover the display area 11A and expose the external connection area 11B. For example, the protective film 11C is made of a transparent dielectric such as silicon oxide ($SiO_2$) and silicon nitride ($SiN_x$). An end face 11D of the protective film 11C is formed along a vertical plane VP including an end face 21A of the sealing substrate 21 corresponding to this end face 11D. Thus, the end face 11D of the protective film 11C is formed into an approximately vertical cross section in the position of the end face 21A of the sealing substrate 21, and the entire display area 11A is covered with the protective film 11C in a uniform film thickness. Consequently, intrusion of moisture or the like into the display area 11A can be prevented, reliability of the organic light emitting devices 10R, 10G, and 10B can be improved, and the frame area, i.e. the external connection area 11B can be reduced.

More specifically, regarding a film thickness distribution of the protective film 11C in the area within 2 mm from the end face 21A of the sealing substrate 21, a relative film thickness is preferably 0.95 or more, when a film thickness T in the position sufficiently inside, for example, at least 100 nm inside from the end face 21A of the sealing substrate 21 is 1. However, it is needless to say that the relative film thickness may be partly under 0.95, influenced by surface characteristics. The reason why the relative film thickness is set to 0.95 or more as above is that such values are within an allowance considering change of film thickness and the like due to a factor in the deposition process of the protective film 11C. Another reason is that when the film thickness distribution is within the above range, a substantial effect, prevention of intrusion of moisture or the like into the display area 11A can be obtained. It is preferable that the thinner the above film thickness T is, the bigger the lower limit of the film thickness distribution is within the above range (for example, 0.97, 0.98 or the like).

It is desirable that the end face 11D of the protective film 11C is a vertical plane corresponding to the vertical plane VP as shown in FIG. 1. However, the end face 11D of the protective film 11C can be slightly slanted to inside, i.e. to the display area 11A side as shown by a dotted line 11E, or to outside, i.e. to the external connection area 11B side as shown by a dotted line 11F. In addition, the end face 11D of the protective film 11C can correspond to the vertical plane VP, or can be slanted to either inside or outside, from one locally to another. However, when the end face 11D does not correspond to the vertical plane VP as the dotted lines 11E and 11F as above, it is preferable that a distance D between a lower end 11G of the end face 11D and the vertical plane VP is set to 2 mm or less. When the distance D is within this range, a total of inner deviance and outer deviance of the lower end 11G of the end face 11D from the vertical plane VP can be at most 4 mm, and the frame area, i.e. the external connection area 11B can be reduced, compared to a conventional way wherein the film thickness of the protective film increases with a slant, and 90% of a given film thickness is attained in the position of about 5 mm inside from the lower end of the protective film.

It is more preferable that the distance D between the lower end 11G of the end face 11D and the vertical plane VP is set to satisfy Mathematical Expression 1.

$$D \leq T \cdot (\tan \theta) \quad \text{[Mathematical Expression 1]}$$

(In the mathematical expression, T represents a film thickness of the protective film 11C in the position sufficiently inside from the end face 21A of the sealing substrate 21, θ represents an angle which is made by a plane 11J which is on the face drawn from an upper end 11H to the lower end 11G of the end face 11D of the protective film 11C, in relation to the vertical plane VP, and its value is within $0° \leq \theta \leq 10°$.)

The reason of setting to $0° \leq \theta \leq 10°$ in Mathematical Expression 1 is that, as described below, when the end face 11D of the protective film 11C is formed by anisotropic etching using the sealing substrate 21 as a mask, angle θ becomes within the above range. Further, since a usual set film thickness of the protective film 11C is from 0.5 μm to 3 μm, it is almost unthinkable that the distance D between the lower end 11G of the end face 11D and the vertical plane VP becomes large close to 2 mm, so that sufficient effect can be obtained practically when $0° \leq \theta \leq 10°$ in Mathematical Expression 1 is satisfied.

This display unit can be, for example, produced as follows.

Figure 4:
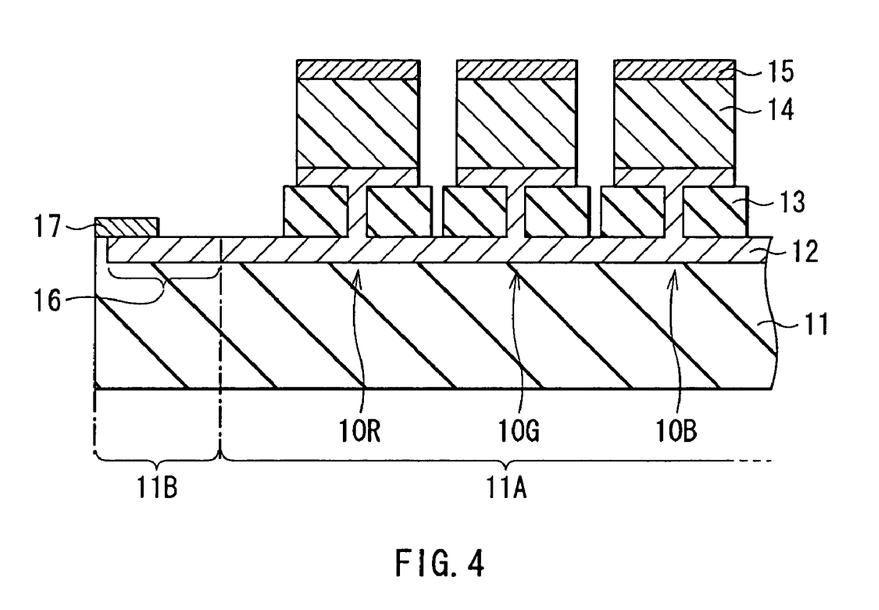
FIG. 4 is a cross sectional view showing a method of manufacturing the display unit illustrated in FIG. 1 in the order of processes.

FIGS. 4 to 7 show a method of manufacturing this display unit in the order of processes. First, as shown in FIG. 4, on the driving substrate 11 made of the above-mentioned material, the first electrode 12 and the insulating film 13 made of the above-mentioned materials are deposited in the foregoing thickness by, for example, DC sputtering, selective etching is made by using, for example, lithography technique, and patterning is made in the form of a given shape. After that, as shown in FIG. 4 as well, the electron hole transport layer 14A, the light emitting layer 14B, the electron transport layer 14C and the second electrode 15 which have the foregoing thickness and are made of the foregoing materials, are sequentially deposited, for example, by deposition, and the organic light emitting devices 10R, 10G, and 10B as shown in FIGS. 2 and 3 are formed. The first electrode 12 and the second electrode 15 form the external connection terminal 16 by extending themselves to the external connection area 11B. Further, on the external connection terminal 16, the external terminal 17 is formed.

Figure 5:
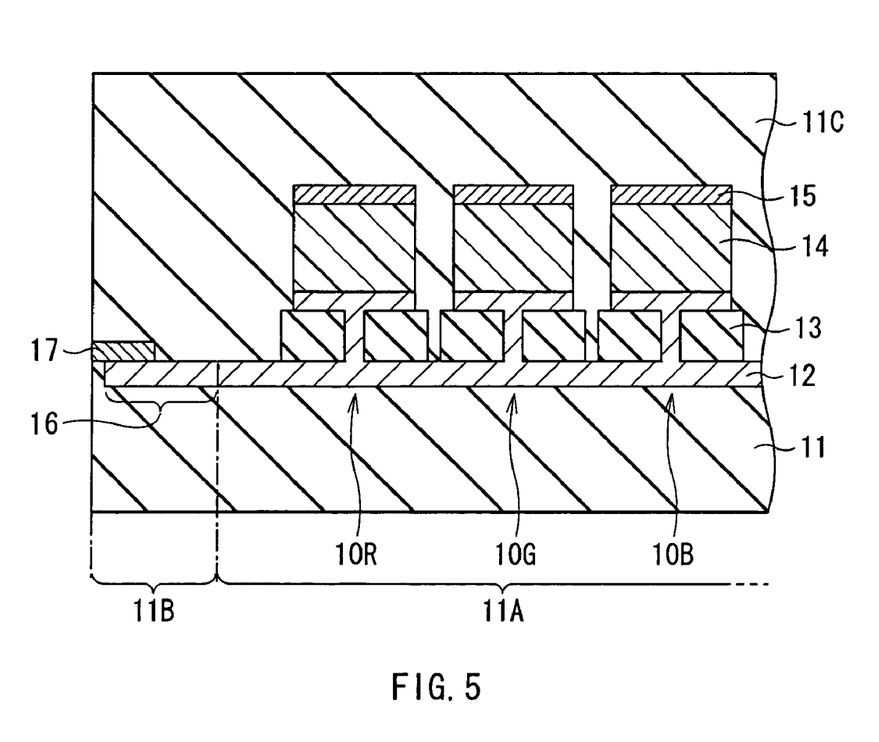
FIG. 5 is a cross sectional view showing a process following FIG. 4.

After that, as shown in FIG. 5, the protective film 11C made of the foregoing material is formed over the whole face on the side of the display area 11A and the external connection area 11B of the driving substrate 11.

Figure 6:
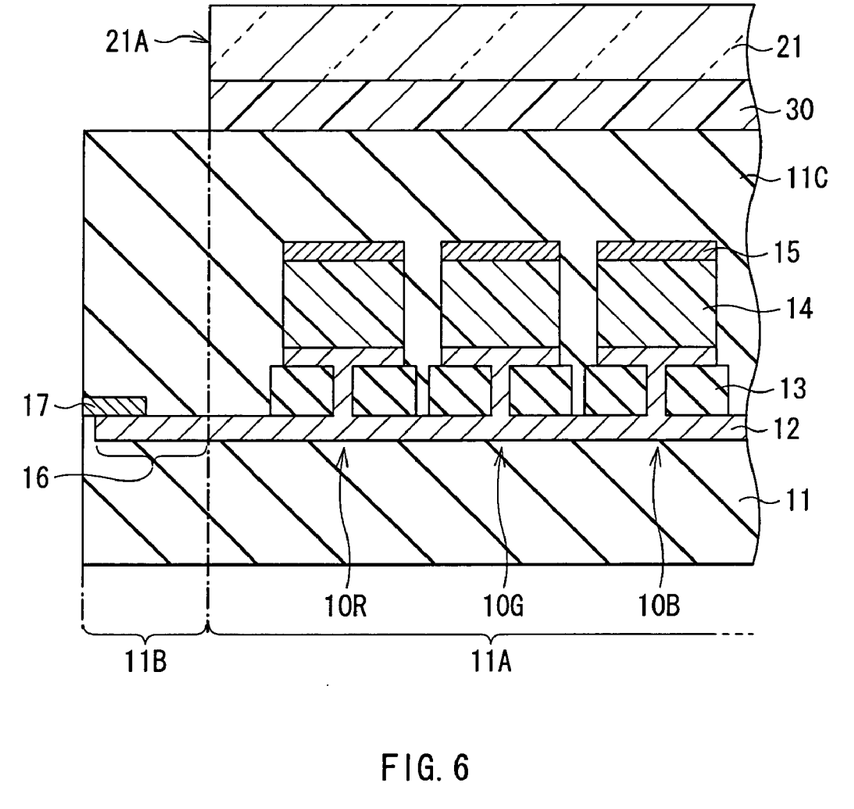
FIG. 6 is a cross sectional view showing a process following FIG. 5.

Subsequently, as shown in FIG. 6, the adhesive layer 30 is formed on the protective film 11C, the sealing substrate 21 is arranged in the area corresponding to the display area 11A of the driving substrate 11, and bonded with the adhesive layer 30 in between. Then, the end face 21A of the sealing substrate 21 is preferably arranged by aligning with a boundary between the display area 11A and the external connection area 11B.

Figure 7:
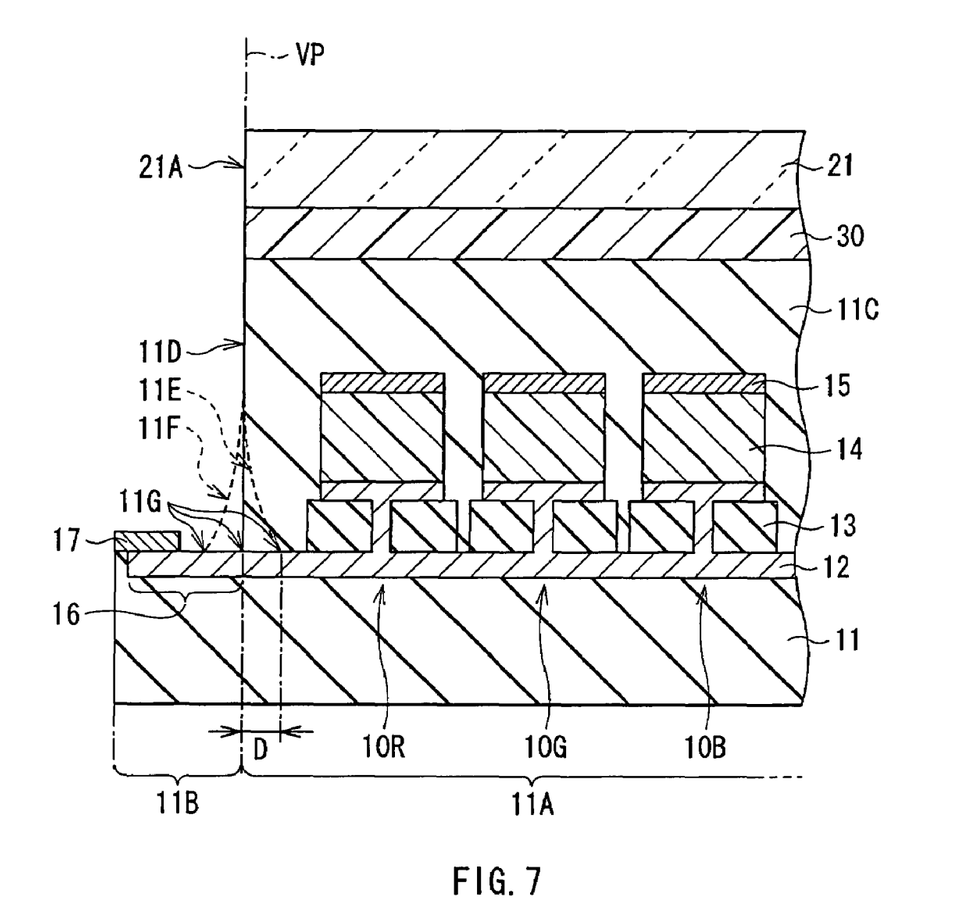
FIG. 7 is a cross sectional view showing a process following FIG. 6.

After that, as shown in FIG. 7, anisotropic etching using the sealing substrate 21 as a mask is performed to the protective film 11C, and the end face 11D of the protective film 11C is formed along the vertical plane VP including the end face 21A of the sealing substrate 21 which lies on the same side as this end face 11D lies. Here, since the sealing substrate 21 is used as a mask, masking is unnecessary, so that its manufacturing process is simplified. In addition, since there is no possibility that the protective film 11C is formed in a state of protruding to the external connection area 11B as conventional, reliability of the external connection terminal 16 can be improved. Anisotropic etching is not specifically limited in case where a method can secure an etching selection ratio of the sealing substrate 21 and the protective film 11C. Examples of etching include etching with RIE (reactive ion etching) and etching with radical source. Further, when performing anisotropic etching, it is preferable to set the distance D between the lower end 11G of the end face 11D and the vertical plane VP to 2 mm or less, and it is more preferable to set the distance D to satisfy Mathematical Expression 1. As above, the display unit shown in FIGS. 1 to 3 is completed.

In this display unit, when a given voltage is applied between the first electrode 12 and the second electrode 15, current is injected into the light emitting layer 14B, and an electron hole and an electron recombines, leading to light emitting mainly at the interface of the light emitting layer 14B. This light is extracted through the second electrode 15, the protective film 11C, and the sealing substrate 21. Then, there is the possibility that moisture or the like intrudes into the display area 11A through the end face 11D of the protective film 11C. However, in this embodiment, the sealing substrate 21 is arranged in the area corresponding to the display area 11A of the driving substrate 11, and the end face 11D of the protective film 11C is formed along the vertical plane VP including the end face 21A of the sealing substrate 21 which lies on the same side as this end face 11D lies. Therefore, the end face 11D of the protective film 11C is formed into an approximately vertical cross section in the position of the end face 21A of the sealing substrate 21, and the entire display area 11A is covered with the protective film 11C in a uniform film thickness. Consequently, intrusion of moisture or the like into the display area 11A is prevented, and reliability of the organic light emitting devices 10R, 10G, and 10B is improved.

As above, according to this embodiment, the sealing substrate 21 is arranged in the area corresponding to the display area 11A of the driving substrate 11, and the end face 11D of the protective film 11C is formed along the vertical plane VP including the end face 21A of the sealing substrate 21 which lies on the same side as this end face 11D lies. Therefore, the end face 11D of the protective film 11C is formed into an approximately vertical cross section in the position of the end face 21A of the sealing substrate 21, and the entire display area 11A is covered with the protective film 11C in a uniform film thickness. Consequently, intrusion of moisture or the like into the display area 11A can be prevented, and reliability of the organic light emitting devices 10R, 10G, and 10B can be improved. In addition, the frame area, i.e. the external connection area 11B can be reduced. In result, particularly in a small organic light emitting display mounted on a portable information device, the display area 11A can be larger with the same-sized display unit.

In particular, since the distance D between the lower end 11G of the end face 11D and the vertical plane VP is set to 2 mm or less, the total of inner deviance and outer deviance of the lower end 11G of the end face 11D from the vertical plane VP can be at most 4 mm, and the frame area, i.e. the external connection area 11B can be reduced, Further, particularly, since the end face 11D of the protective film 11C is formed by anisotropic etching using the sealing substrate 21 as a mask, masking is unnecessary, so that its manufacturing process is simplified. In addition, since there is no possibility that the protective film 11C is formed in a state of protruding to the external connection area 11B as conventional, reliability of the external connection terminal 16 can be improved.

EXAMPLES

Further, concrete examples of the invention will be described below.

Example 1

In the driving substrate 11, the display area 11A was formed and the external connection area 11B was formed adjacently to the display area 11A in the same manner as in the foregoing embodiment, except that the organic light emitting device 10G was only provided. Further, the protective film 11C made of $SiN_x$ in its set film thickness of 2 μm was formed over the whole face of the driving substrate 11. As conditions for deposition, a plasma CVD unit with 13.56 MHz was used, $SiH_4$, $NH_3$, and $N_2$ were supplied in respective flows of 100 sccm, 400 sccm, and 2,000 sccm, and 60 Pa and 100W were applied. After that, the sealing substrate 21 was arranged in the area corresponding to the display area 11A of the driving substrate 11, the driving substrate 11 and the sealing substrate 21 were bonded with the adhesive layer 30 in between, and the end face 11D of the protective film 11C was formed by anisotropic etching using the sealing substrate 21 as a mask. In such anisotropic etching, a RIE unit was used, and as etching conditions, $CF_4$ and $O_2$ were supplied in respective flows of 200 sccm and 50 sccm, and RF output was 200W.

Example 2

A display unit was produced in the same manner as in Example 1, except that a radical source was used in anisotropic etching, and $CF_4$ was radicalized. As the radical source, USC made by ULVAC was used.

Figure 8:
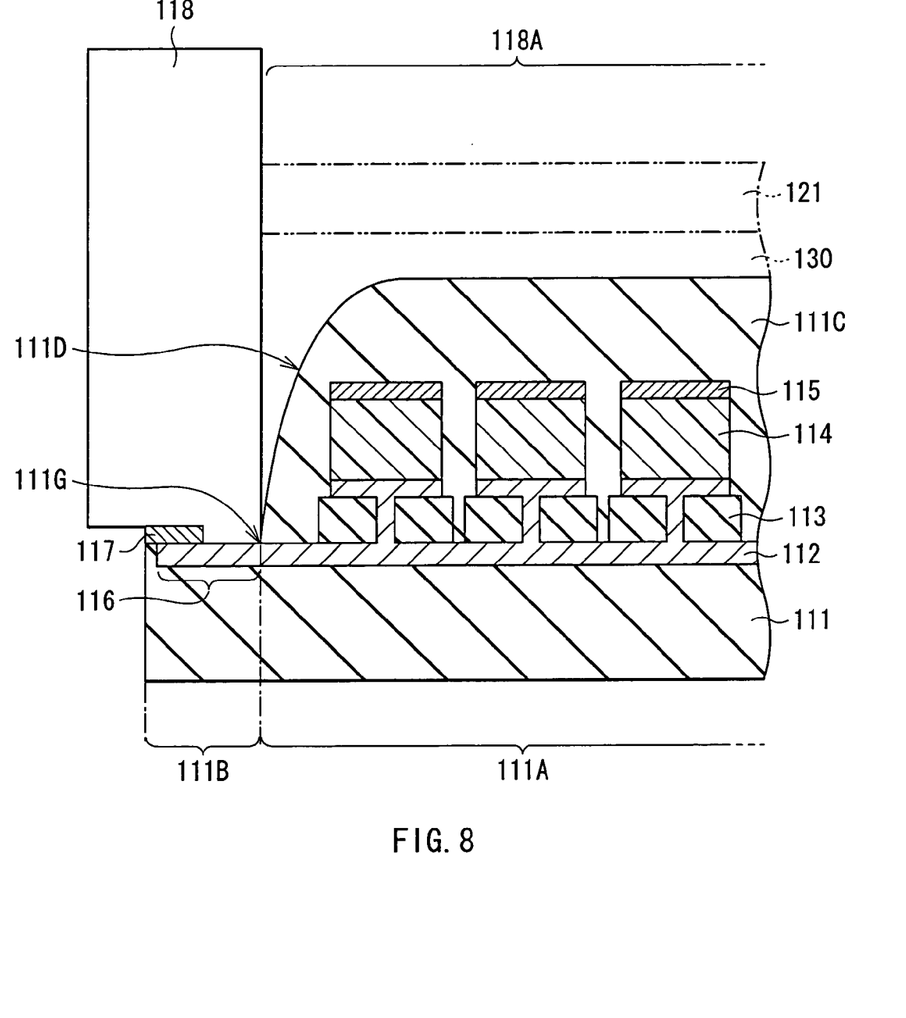
FIG. 8 is a cross sectional view showing a method of manufacturing a display unit according to a comparative example of the invention.

As a comparative example in relation to Examples 1 and 2, a display unit was produced in the same manner as in Example 1, except that an external connection area 111B was covered with a mask 118 in a thickness of 1 mm made of $Al_2O$, a protective film 111C was formed in a display area 111A, and then the protective film 111C and a sealing substrate 121 were bonded with an adhesive layer 130 in between, as shown in FIG. 8. Then, the mask 118 was formed so that an opening 118A becomes the same size as that of the sealing substrate 121, in order to obtain the external connection area 111B of the comparative example with the same size as that of the external connection area 11B of Examples 1 and 2. In FIG. 8, components corresponding to those in FIG. 1 are applied with symbols which have additional number 1 on the top of the symbols in FIG. 1.

After retaining the obtained display units of Examples 1, 2 and the comparative example for 1,000 hours in an environment of 65° C. and relative humidity of 90%, their light emitting faces were checked. The results are shown respectively in FIGS. 9 to 11.

Figure 9:
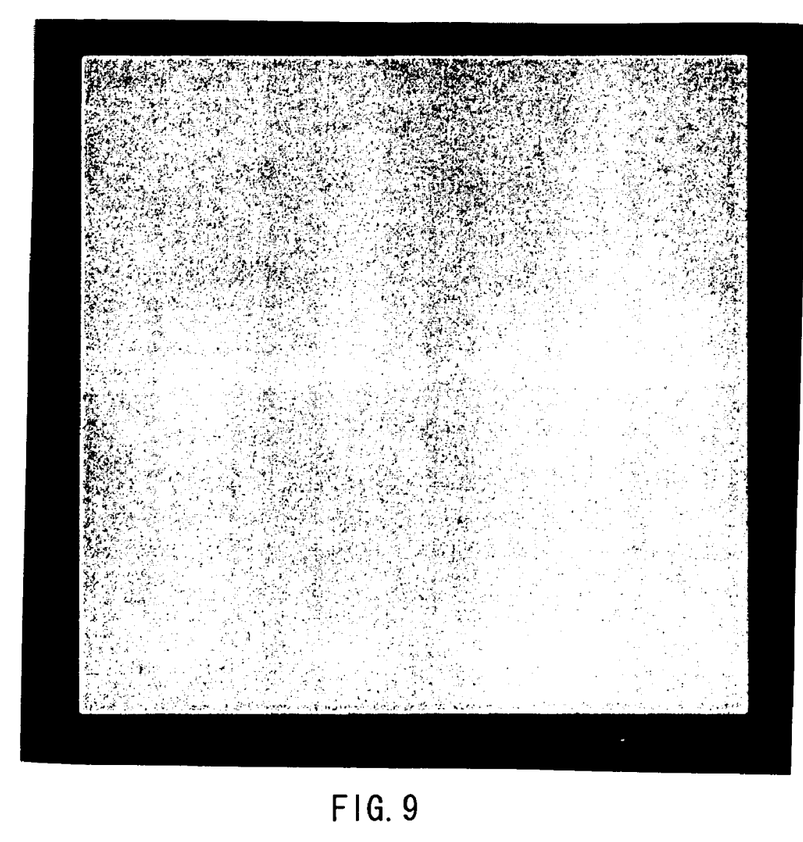
FIG. 9 is a photo showing a state of a light emitting face of a display unit according to Example 1 of the invention after a hot and humid test.
Figure 10:
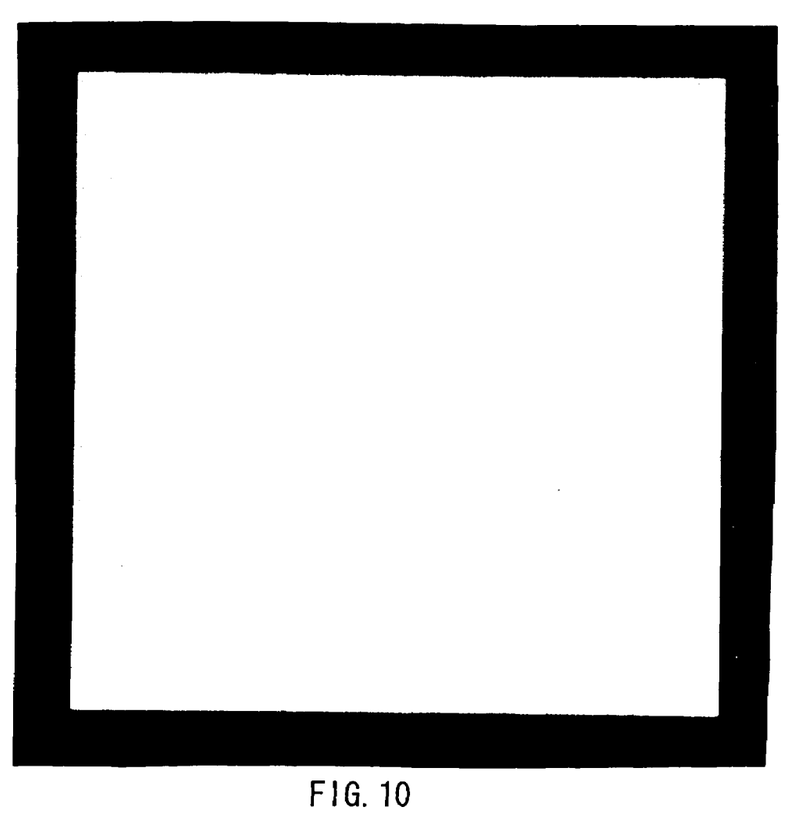
FIG. 10 is a photo showing a state of a light emitting face of a display unit according to Example 2 of the invention after a hot and humid test.
Figure 11:
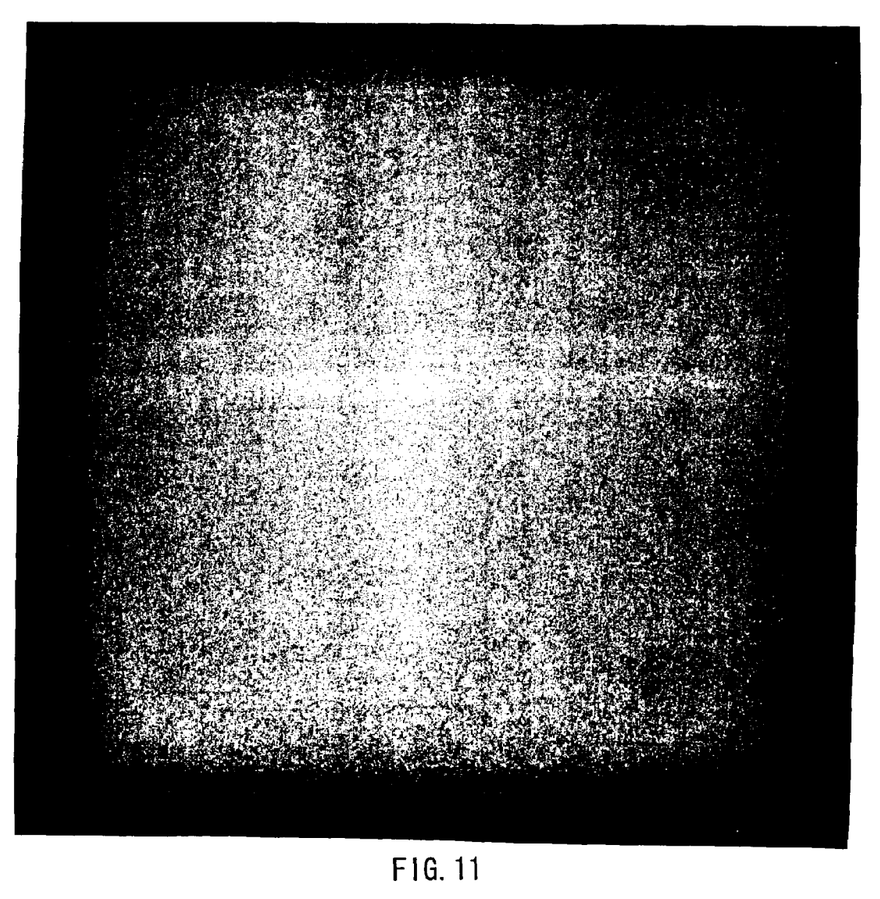
FIG. 11 is a photo showing a state of a light emitting face of the display unit according to the comparative example of the invention after a hot and humid test.
Figure 12:
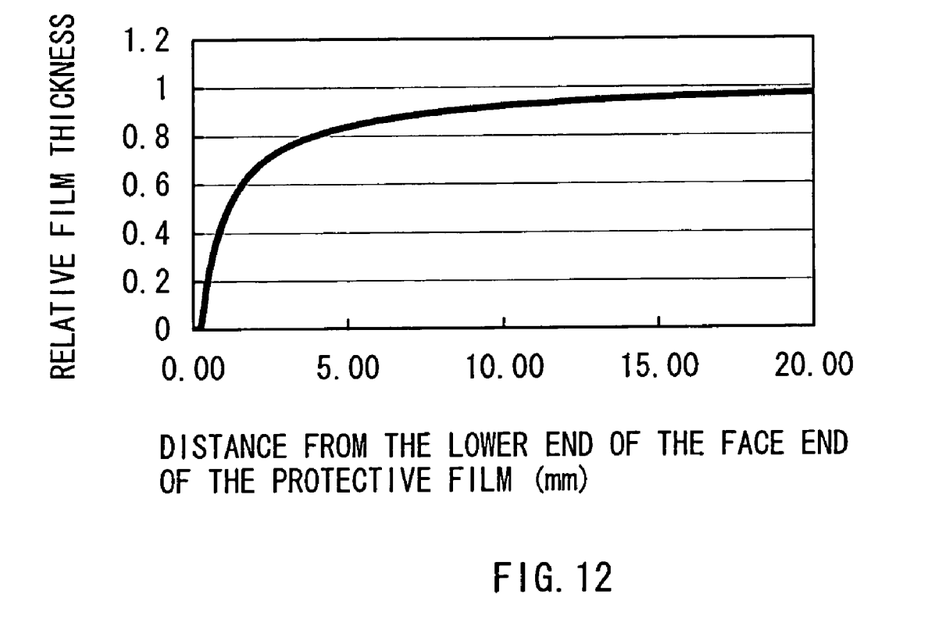
FIG. 12 is a figure showing a film thickness distribution of an end face of a protective film of the display unit according to the comparative example of the invention.

As evidenced by FIGS. 9 to 11, while the display units of Examples 1 and 2 showed no deterioration of luminance, the display unit of the comparative example showed progressive decline of luminance from its peripheral part. When cross sections of respective display units were observed by a scanning electron microscope (SEM) after the retention of 1,000 hours, while in Examples 1 and 2, the end face 11D of the protective film 11C became a vertical cross section as shown in FIG. 1, in the comparative example, a film thickness distribution as shown in FIG. 12 was recognized in an end face 111D of the protective film 111C. In the position of horizontally 2 mm inside from a lower end 111G of the end face 111D, the attained film thickness was about 50% of a film thickness in the position of sufficiently inside from the lower end 111G of the end face 111D.

Namely, it was clarified that, in the case where the protective film 11C is formed over the whole face of the driving substrate 11, the sealing substrate 21 is arranged in the area corresponding to the display area 11A of the driving substrate 11, and then anisotropic etching using the sealing substrate 21 as a mask is performed, the end face 11D of the protective film 11C can be formed along the vertical plane VP including the end face 21A of the sealing substrate 21 which lies on the same side as this end face 11D lies, the entire display area 11A is covered with the protective film 11C in a uniform film thickness so that intrusion of moisture or the like into the display area 11A is prevented, and deterioration of luminance of the organic light emitting devices 10R, 10G, and 10B can be prevented.

While the invention has been described with reference to the embodiment, the invention is not limited to the foregoing embodiment, and various modifications may be made. For example, materials, thickness, deposition methods, and deposition conditions for each layer are not limited to those described in the foregoing embodiment, and other materials, thickness, deposition methods, and deposition conditions can be applied. For example, though in the foregoing embodiment, the case using the protective film 11C made of $SiN_x$ has been described, the protective film 11C can be made of $AlO_2$, and a structure combining a $SiN_x$ film and an $AlO_2$ film can be applied. Further, deposition of the protective film 11C can be made by sputter method in addition to CVD. Furthermore, as for anisotropic etching for the protective film 11C, high selected ratio gas such as octafluorobenzene can be used.

Further, for example, though in the foregoing embodiment, the case wherein the first electrode 12, the insulating film 13, the organic layer 14, and the second electrode 15 are layered on the driving substrate 11 in this order from the driving substrate 11 side, and lights are extracted from the sealing panel 20 side has been described, it is also possible that the second electrode 15, the insulating film 13, the organic layer 14 and the first electrode 12 are layered on the driving substrate 11 from the driving substrate 11 side in the opposite order to the above-mentioned order, and lights are extracted from the driving substrate 11 side.

Further, for example, though in the foregoing embodiment, the case using the first electrode 12 as an anode and using the second electrode 15 as a cathode has been described, it is possible to adversely use the first electrode 12 as a cathode and use the second electrode 15 as an anode. In this case, as a material for the second electrode 15, a simple substance or an alloy of gold, silver, platinum, copper and the like that have high work function is suitable. However, other materials can be used by providing a thin film layer for electron hole injection between the second electrode 15 and the organic layer 14. In addition, it is possible that along with using the first electrode 12 as a cathode and the second electrode 15 as an anode, the second electrode 15, the insulating film 13, the organic layer 14, and the first electrode 12 are layered on the driving substrate 11 in this order from the driving substrate 11 side, and lights are extracted from the driving substrate 11 side.

Further, though in the foregoing embodiment, the constructions of the organic light emitting device has been specifically described, not all the layers such as the insulating film 13 should be provided, and other layers can be further provided. For example, the first electrode 12 can be a two-layers structure wherein a transparent conductive film is layered on a reflection film such as a dielectric multi-layered film and Al.

Further, though in the foregoing embodiment, the case wherein the second electrode 15 is made of the semi-transparent electrode has been described, the second electrode 15 can have a structure wherein a semi-transparent electrode and a transparent electrode are layered in this order from the first electrode 12 side. This transparent electrode is used for lowering an electric resistance of the semi-transparent electrode, and made of a conductive material having sufficient translucency to the light generated in the light emitting layer. As a material to make the transparent electrode, for example, ITO, or a compound (IZO) containing indium, zinc (Zn), and oxygen is preferable, since good conductivity can be obtained by using these materials even if deposition is made at room temperature. A thickness of the transparent electrode can be, for example, 30 nm to 1,000 nm.

Further, though in the foregoing embodiment, the case wherein the organic light emitting devices 10R, 10G, and 10B are formed in the display area 11A has been described, this invention can be applied to the case wherein a natural light element such as an inorganic electroluminescence device is formed in the display area 11A, or the case wherein a liquid crystal display element is formed in the display area 11A.

As described above, according to the display unit of the invention or the method of manufacturing the display unit of the invention, since the sealing substrate is arranged in the area corresponding to the display area of the driving substrate, and the end face of the protective film is formed along the vertical plane including the corresponding end face of the sealing substrate, the end face of the protective film is formed into the approximately vertical cross section in the position of the end face of the sealing substrate, and the entire display area is covered with the protective film in a uniform film thickness. Consequently, intrusion of moisture or the like into the display area can be prevented, reliability can be improved, and the frame area, i.e. the external connection area can be reduced. In result, particularly in a small organic light emitting display mounted on a portable information device or the like, its display area can be larger with the same-sized display unit.

According to the display unit of one aspect of the invention, since the distance D between the lower end of the end face of the protective film and the vertical plane is set to 2 mm or less, the deviance of the lower end of the end face of the protective film from the vertical plane can be at most 4 mm, and the frame area, i.e. the external connection area can be reduced.

According to the method of manufacturing the display according to one aspect of the invention, since the end face of the protective film is formed by anisotropic etching using the sealing substrate as a mask, masking is unnecessary, so that its manufacturing process is simplified. In addition, since there is no possibility that the protective film is formed protruding to the external connection area as conventional, reliability of the external connection terminal can be improved.

Obviously many modifications and variations of the present invention are possible in the light of the above teachings. It is therefore to be understood that within the scope of the appended claims the invention may be practiced otherwise than as specifically described.

What is claimed is:

1. A display unit, comprising:
a driving substrate having a display area and an external connection area spaced by a boundary therebetween;
a sealing substrate; and
a protective film which covers the display area and exposes the external connection area;
wherein,
an end face of the protective film formed along a vertical plane including an end face of the sealing substrate,
a lower end of the end face of the protective film slants away from the vertical plane in proximity of the boundary between the display area and the external connection area, and
the distance D between the lower end of the end face of the protective film and the vertical plane satisfies Mathematical Expression: $D \leq T \cdot \tan \theta$, where T represents a film thickness of the protective film in the position sufficiently inside from the end face of the sealing substrate, $\theta$ represents an angle which is made by a plane which is on the face drawn from an upper end to the lower end of the end face of the protective film, in relation to the vertical plane, and its value is within $0° < \theta \leq 10°$.

2. A display unit according to claim 1, wherein a distance D between the lower end of the end face of the protective film and the vertical plane is set to 2 mm or less.

3. A display unit according to claim 1, wherein an organic light emitting device, which has an organic layer including a light emitting layer between a first electrode and a second electrode, and which sends out the lights generated in the light emitting layer from the second electrode side is formed in the display area.

4. A display unit according to claim 1, wherein the driving substrate and the sealing substrate are bonded with an adhesive layer in between.

5. A display unit according to claim 1, wherein regarding a film thickness distribution of the protective film in an area within 2 mm from the end face of the sealing substrate an average film thickness is 0.95 or more of a film thickness in the position sufficiently inside from the end face of the sealing substrate.

* * * * *